(12) United States Patent
Jang et al.

(10) Patent No.: US 11,133,198 B2
(45) Date of Patent: Sep. 28, 2021

(54) METHOD OF MANUFACTURING PACKAGED DEVICE CHIP

(71) Applicant: DISCO CORPORATION, Tokyo (JP)

(72) Inventors: Byeongdeck Jang, Tokyo (JP); Youngsuk Kim, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/854,149

(22) Filed: Apr. 21, 2020

(65) Prior Publication Data

US 2020/0343108 A1    Oct. 29, 2020

(30) Foreign Application Priority Data

Apr. 25, 2019  (JP) .............................. JP2019-083688

(51) Int. Cl.
    *H01L 21/56*  (2006.01)
    *H01L 21/78*  (2006.01)
    *H01L 23/544* (2006.01)

(52) U.S. Cl.
    CPC .............. *H01L 21/56* (2013.01); *H01L 21/78* (2013.01); *H01L 23/544* (2013.01)

(58) Field of Classification Search
    CPC ....... H01L 21/56; H01L 21/78; H01L 23/544; H01L 21/6836
    See application file for complete search history.

(56) References Cited

U.S. PATENT DOCUMENTS

| 7,105,423 B2 * | 9/2006 | Yamano .................. H01L 24/05 438/460 |
| 2011/0221071 A1 * | 9/2011 | Motohashi .......... H01L 21/6835 257/774 |
| 2013/0280826 A1 * | 10/2013 | Scanlan .................. H01L 24/05 438/15 |
| 2014/0004658 A1 * | 1/2014 | Priewasser ............ H01L 21/561 438/118 |

FOREIGN PATENT DOCUMENTS

JP         2018060918 A    4/2018

* cited by examiner

*Primary Examiner* — Nicholas J Tobergte
(74) *Attorney, Agent, or Firm* — Greer Burns & Crain Ltd.

(57) ABSTRACT

A method of manufacturing a packaged device chip includes the steps of forming a rewiring layer having rewiring patterns respectively in a plurality of areas demarcated on the rewiring layer by a projected dicing line on a first surface of a support member that has a second surface opposite the first surface, forming a dividing groove for dividing the rewiring layer in the rewiring layer along the projected dicing line, placing device chips in the respective areas on the rewiring layer and connecting the rewiring patterns and the device chips to each other, covering the device chips and the rewiring layer with molded resin while filling the dividing groove with the molded resin, and cutting the molded resin across an area disposed within the dividing groove and narrower than the dividing groove and forming packaged device chips.

6 Claims, 5 Drawing Sheets

METHOD OF MANUFACTURING PACKAGED DEVICE CHIP

BACKGROUND OF THE INVENTION

Field of the Invention

The present invention relates to a method of manufacturing a packaged device chip including a device chip encapsulated by molded resin.

Description of the Related Art

Device chips having devices such as integrated circuits are connected face-down to electrodes on a packaging board by way of flip-chip bonding, for example, and then encapsulated by molded resin. Packaged device chips thus fabricated by encapsulating the device chips with molded resin are protected from external factors including impact, light, heat, and water.

In recent years, as interconnects on devices become finer and finer, electrodes on device chips, distances between electrodes, etc. are also reduced, making it impractical to form external connection terminals corresponding to the electrodes in matching areas on a board. Accordingly, efforts have been made to develop a fan-out packaging technology for forming external connection terminals in areas wider than device chips by using the wafer-level rewiring technology (see, for example, Japanese Patent Laid-Open No. 2018-60918).

SUMMARY OF THE INVENTION

According to the above fan-out packaging technology, a rewiring layer is formed on the surface of a support member, and device chips are connected face-down to the rewiring layer. Thereafter, the device chips are encapsulated by molded resin, and the molded resin together with the rewriting layer is cut into packaged device chips.

However, when the molded resin and the rewiring layer are cut simultaneously together using a laser beam, a cutting blade, or the like, a load is imposed on the interface between the molded resin and the rewiring layer, tending to cause the rewiring layer to peel off the molded resin. If the rewiring layer peels off the molded resin, water or the like is likely to find its way into the device chips from the peeled-off region and to make devices defective.

It is therefore an object of the present invention to provide a method of manufacturing a packaged device chip in which a rewiring layer is less likely to peel off molded resin.

In accordance with an aspect of the present invention, there is provided a method of manufacturing a packaged device chip, including the steps of forming a rewiring layer having rewiring patterns respectively in a plurality of areas demarcated on the rewiring layer by a projected dicing line on a first surface of a support member that has a second surface opposite the first surface, thereafter, forming a dividing groove for dividing the rewiring layer in the rewiring layer along the projected dicing line, placing device chips in the respective areas on the rewiring layer and connecting the rewiring patterns and the device chips to each other, thereafter, covering the device chips and the rewiring layer with molded resin while filling the dividing groove with the molded resin, and thereafter, cutting the molded resin across an area disposed within the dividing groove and narrower than the dividing groove and forming packaged device chips in which the device chips are covered with the molded resin. In the abovementioned method of manufacturing a packaged device chip, the rewiring layer has side surfaces covered with the molded resin.

According to the aspect of the present invention, the method may further include the step of, after the step of covering the device chips and the rewiring layer with the molded resin, peeling the rewiring layer and the molded resin off the support member to form a molded plate in which the rewiring layer and the device chips are integrally combined with each other by the molded resin.

According to the aspect of the present invention, the molded resin and the support member may be cut together in the step of cutting the molded resin.

In the method of manufacturing a packaged device chip according to the aspect of the present invention, the dividing groove for dividing the rewiring layer is formed in the rewiring layer, and the device chips and the rewiring layer are covered with the molded resin as it fills the dividing groove, after which the molded resin is cut across the area disposed within the dividing groove and narrower than the dividing groove, thereby forming packaged device chips. Therefore, the molded resin and the rewiring layer are not cut simultaneously together.

Since a smaller load is imposed on the interface between the molded resin and the rewiring layer than in a case where the molded resin and the rewiring layer are cut simultaneously together, the rewiring layer is less liable to peel off the molded resin. Furthermore, as the side surfaces of the rewiring layer are covered with the molded resin, the produced packaged device chips are highly reliable.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Embodiments of the present invention will be described below with reference to the accompanying drawings. In Embodiment 1, a method of manufacturing a packaged device chip from which a support member is removed and does not finally remain therein will be described. In Embodiment 2, a method of manufacturing a packaged device chip from which a support member is not removed and finally remains therein will be described.

Embodiment 1

Figure 1A:
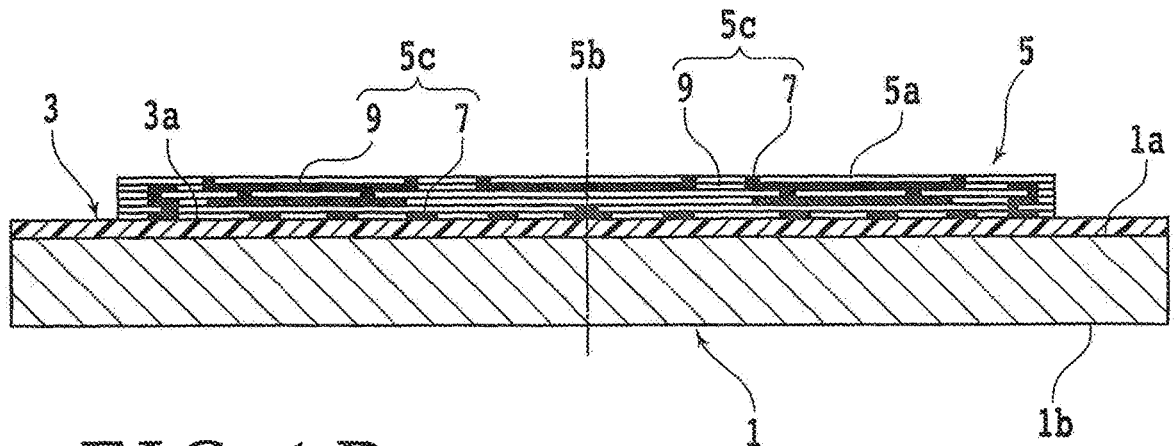
FIG. 1A is a cross-sectional view illustrating the state in which a rewiring layer is formed on a support member according to Embodiment 1 of the present invention.

In a method of manufacturing a packaged device chip according to Embodiment 1, a rewiring layer is formed on a surface of a support member (rewiring layer forming step). FIG. 1A is a cross-sectional view illustrating the state in which a rewiring layer 5 is formed on a support member 1 according to Embodiment 1. As illustrated in FIG. 1A, the support member 1 according to the present embodiment is shaped as a plate or film made of glass, ceramics, resin, metal, semiconductor, or the like and has a first surface 1a and a second surface 1b opposite the first surface 1a.

The support member 1 as viewed in a direction perpendicular to the first surface 1a or the second surface 1b, i.e., the first surface 1a or the second surface 1b, is of a rectangular or circular shape. However, the first surface 1a and the second surface 1b are not limited to any particular shape. The first surface 1a and the second surface 1b may be of an elliptical shape, any polygonal shape, or the like. The support member 1 may be in the form of a glass carrier, a resin plate, a protective tape, a metal plate, a silicon wafer, or the like.

According to the present embodiment, a provisional adhesive layer 3 is formed on the first surface 1a of the support member 1, and then a rewiring layer 5 is formed on an exposed surface 3a, i.e., a surface opposite the surface facing the support member 1, of the provisional adhesive layer 3. The provisional adhesive layer 3 is formed by coating the first surface 1a of the support member 1 with liquid resin, i.e., an organic material, and drying or curing the liquid resin. The provisional adhesive layer 3 is secured in position with a strength small enough to allow the rewiring layer 5, etc. on the surface 3a to be peeled off.

The liquid resin is applied to the first surface 1a of the support member 1 by any process such as a spin coating process, a spray coating process, a screen printing process, a dip coating process, or an ink jet process. The provisional adhesive layer 3 is not limited to any particular material, any particular fabrication process, etc. The provisional adhesive layer 3 may be made of metal, inorganic material, or the like. The provisional adhesive layer 3 may be formed by a process such as chemical vapor deposition (CVD) or physical vapor deposition (PVD).

After the provisional adhesive layer 3 has been formed on the first surface 1a of the support member 1, the rewiring layer 5 is formed on the exposed surface 3a of the provisional adhesive layer 3. The rewiring layer 5 is formed by stacking electrically conductive layers 7 functioning as interconnects or the like and insulating layers 9 providing insulation between the interconnects or the like. In other words, the rewiring layer 5 includes a layered structure of electrically conductive layers 7 and insulating layers 9.

The electrically conductive layers 7 and the insulating layers 9 that make up the rewiring layer 5 are obtained by processing metal films and insulation films formed by a process such as CVD or PVD according to a process such as photolithography or etching. However, the formation of the rewiring layer 5 is not limited to any particular fabrication process. For example, the rewiring layer 5 may be formed according to a process such as plating or chemical mechanical polishing (CMP).

The rewiring layer 5 has an exposed surface 5a, i.e., a surface opposite the surface facing the provisional adhesive layer 3, demarcated into a plurality of areas by projected dicing lines 5b generally parallel to the surface 5a. Each of the areas includes a rewiring pattern 5c of electrically conductive layers 7 and insulating layers 9. In other words, the electrically conductive layers 7 and the insulating layers 9 are formed such that each of the areas demarcated by the projected dicing lines 5b includes a rewiring pattern 5c. Some of the electrically conductive layers 7 of the rewiring patterns 5c are exposed on the surface 5a of the rewiring layer 5.

Figure 1B:
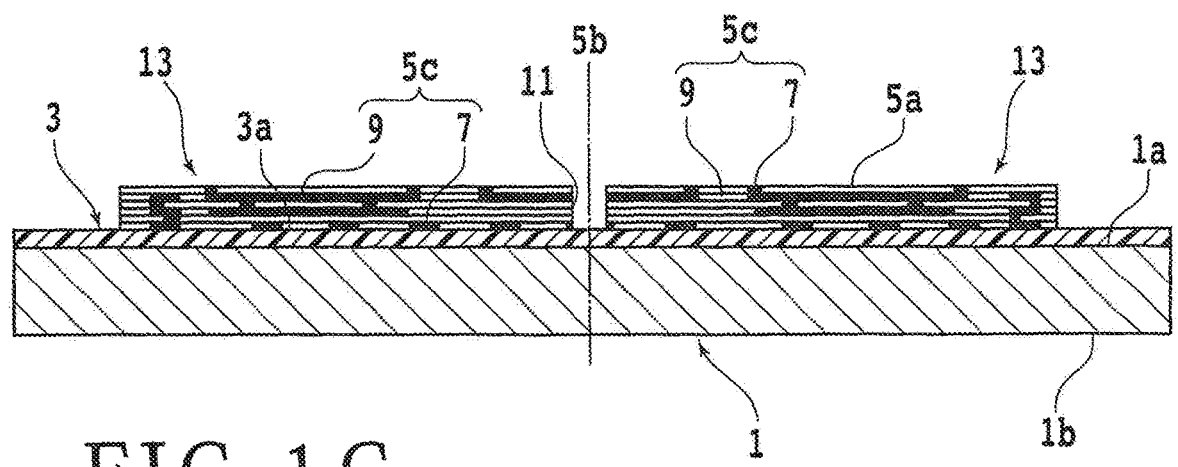
FIG. 1B is a cross-sectional view illustrating the state in which a dividing groove for dividing the rewiring layer is formed therein.

After the rewiring layer 5 has been formed on the support member 1, dividing grooves for dividing the rewiring layer 5 are formed therein along the projected dicing lines 5b (dividing groove forming step). FIG. 1B is a cross-sectional view illustrating the state in which a dividing groove 11 for dividing the rewiring layer 5 is formed therein. According to the present embodiment, an unillustrated cutting blade including a plurality of abrasive grains bound together by a bonding agent is rotated and moved to cut into the rewiring layer 5 at a position superposed on a projected dicing line 5b.

More specifically, for example, an image of the rewiring layer 5 is captured by an unillustrated camera or the like, and the position of a projected dicing line 5b is detected from the captured image. Then, the cutting blade is moved to cut into the rewiring layer 5 along the projected dicing line 5b to a depth at the interface between the provisional adhesive layer 3 and the rewiring layer 5, thereby forming a dividing groove 11 in the rewiring layer 5 along the projected dicing line 5b with the provisional adhesive layer 3 exposed at the bottom of the dividing groove 11. The dividing groove 11 formed in the rewiring layer 5 along the projected dicing line 5b divides the rewiring layer 5 into a plurality of rewiring layers 13. Each of the rewiring layers 13 includes the rewiring pattern 5c.

The formation of the dividing groove 11 is not limited to any particular forming process. For example, the dividing groove 11 may be formed by an ablation process in which a laser beam having a wavelength absorbable or easily absorbable by the rewiring layer 5 is applied to the rewiring layer 5. In the ablation process, the power of the laser beam, the number of times that the laser beam is applied, etc. are adjusted to enable formation of the dividing groove 11 for dividing the rewiring layer 5 in the rewiring layer 5.

Figure 1C:
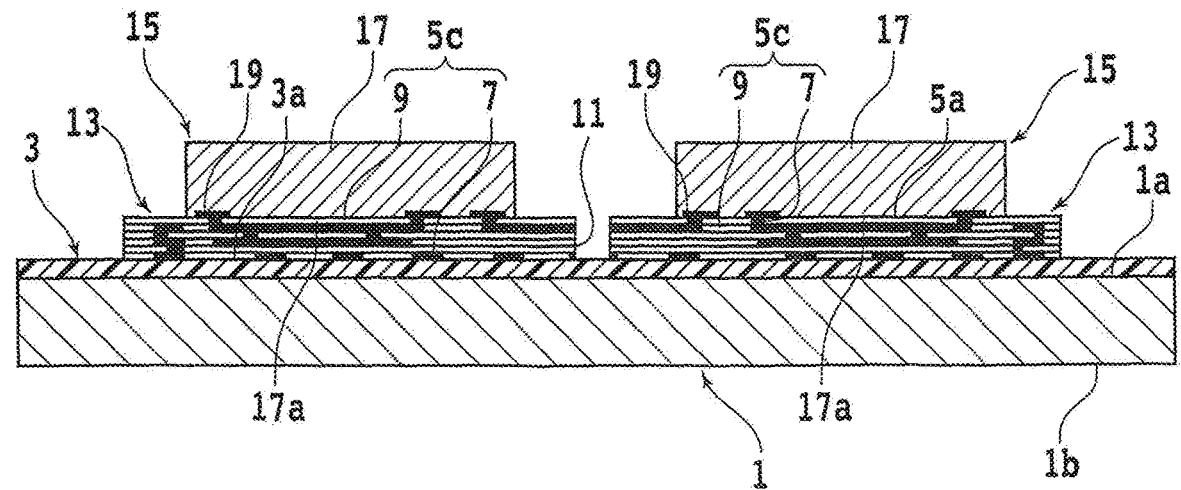
FIG. 1C is a cross-sectional view illustrating the state in which rewiring patterns included in rewiring layers and device chips are connected to each other.

After the dividing groove 11 has been formed in the rewiring layer 5, device chips are placed on the respective rewiring layers 13, i.e., a plurality of areas of the rewiring layer 5, and the rewiring patterns 5c included in the respective rewiring layers 13 are connected to the device chips (device chip connecting step). FIG. 1C is a cross-sectional view illustrating the state in which the rewiring patterns 5c included in the rewiring layers 13 and device chips 15 are connected to each other.

The device chips 15 include substrates 17 made of a semiconductor such as silicon. Unillustrated devices, such as integrated circuits, are formed on surfaces 17a of the substrates 17. The devices have electrodes 19 exposed on the surfaces 17a. According to the present embodiment, the device chips 15 are placed on and fixed to the respective rewiring layers 13, i.e., the plural areas of the rewiring layer 5, such that the electrodes 19 of the devices are connected to the electrically conductive layers 7, i.e., the rewiring patterns 5c, exposed on the surfaces 5a of the rewiring layers 13.

Specifically, the electrically conductive layers 7 and the electrodes 19 are connected to each other, fixing the device chips 15 to the rewiring layers 13, according to a process such as non-conductive film bonding, ultrasonic bonding, thermal compression bonding, or controlled collapsed chip connection (C4). However, the bonding of the electrically conductive layers 7 and the electrodes 19 is not limited to any particular bonding process, i.e., the fixing of the device chips 15 and the rewiring layers 13 is not limited to any particular fixing process. Furthermore, the device chips 15 are not limited to any particular material, any particular shape, any particular structure, any particular size, etc.

Figure 2A:
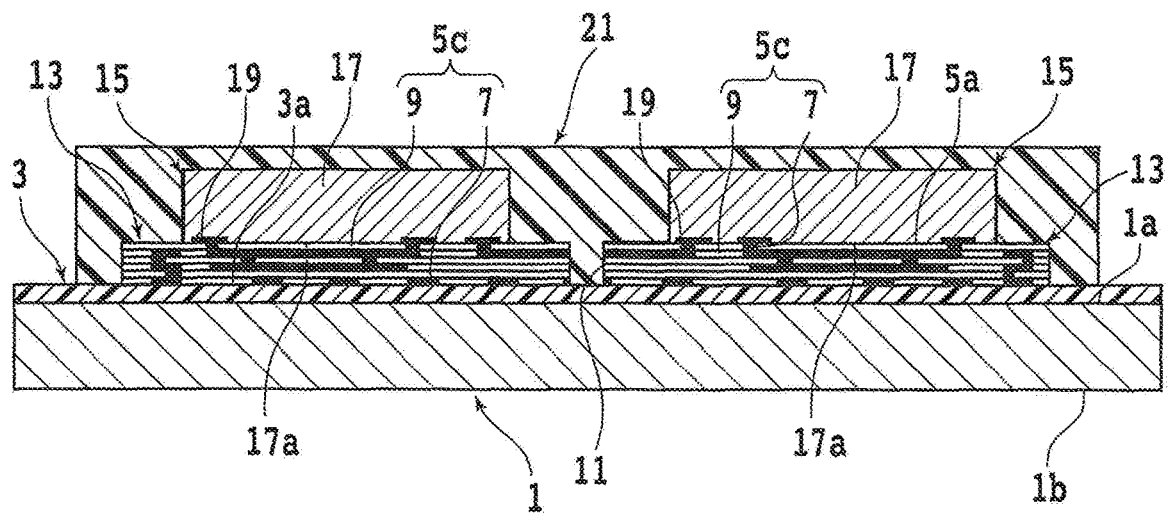
FIG. 2A is a cross-sectional view illustrating the state in which the device chips and the rewiring layers are covered with molded resin according to Embodiment 1.

After the dividing groove 11 has been formed in the rewiring layer 5 and the rewiring patterns 5c and the device chips 15 have been connected to each other, the device chips 15 and the rewiring layers 13 are covered with molded resin as it fills the dividing groove 11 (molding step). FIG. 2A is a cross-sectional view illustrating the state in which the device chips 15 and the rewiring layers 13 are covered with molded resin 21.

When the device chips 15 and the rewiring layers 13 are to be covered with the molded resin 21, an unillustrated mold frame is disposed on the first surface 1a of the support member 1, and the inner space of the mold frame is filled with liquid resin. As a result, the liquid resin fills the dividing groove 11 and covers the device chips 15 and the rewiring layers 13. The liquid resin may be, for example, a curable resin that can be cured by light applied thereto, heat applied thereto, or the like.

After the inner space of the mold frame has been filled with the liquid resin, the liquid resin is cured into the molded resin 21. The cured molded resin 21 covers the device chips 15 for protection against external factors including impact, light, heat, and water. The molded resin 21 also fills the dividing groove 11.

Figure 2B:
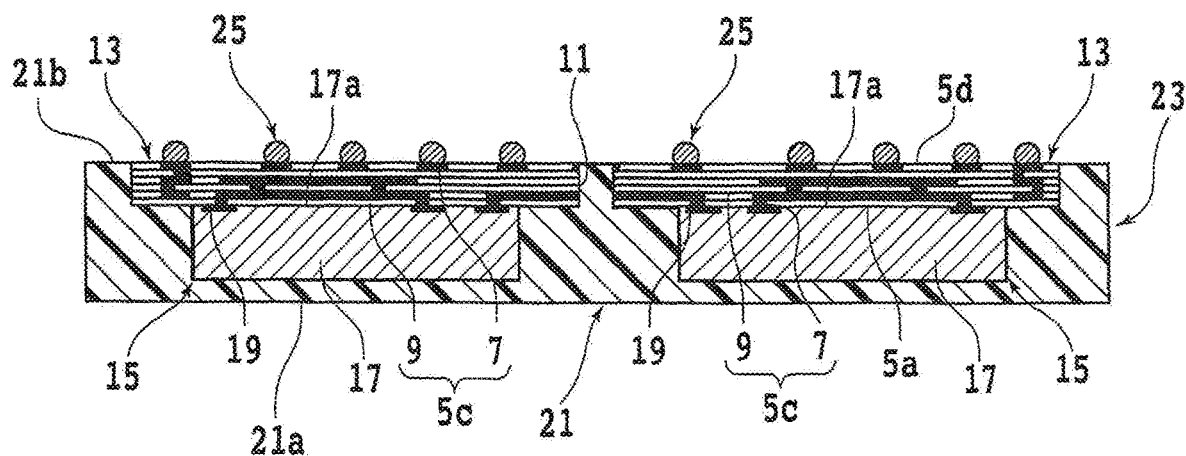
FIG. 2B is a cross-sectional view illustrating the state in which bumps are disposed on a molded plate produced by peeling the rewiring layers and the molded resin off the support member.

After the molded resin 21 has been formed in covering relation to the device chips 15 and the rewiring layers 13, the rewiring layers 13 and the molded resin 21 are peeled off the support member 1, as a molded plate in which the rewiring layers 13 and the device chips 15 are integrally combined with each other by the molded resin 21 is formed (support member peeling step). FIG. 2B is a cross-sectional view illustrating the state in which bumps 25 are disposed on a molded plate 23 produced by peeling the rewiring layers 13 and the molded resin 21 off the support member 1.

For peeling the rewiring layers 13 and the molded resin 21 off the support member 1, an exposed face side 21a, i.e., a side opposite the side facing the provisional adhesive layer 3, of the molded resin 21, for example, is held, and a force directed away from the molded resin 21 is applied to the support member 1. As described above, the provisional adhesive layer 3 is secured in position or held with a strength small enough to allow the rewiring layers 13, the molded resin 21, etc. on the surface 3a to be peeled off.

Therefore, when the force directed away from the molded resin 21 is applied to the support member 1, the rewiring layers 13 and the molded resin 21 are peeled off the surface 3a of the provisional adhesive layer 3. In other words, the rewiring layers 13 and the molded resin 21 are peeled off the support member 1 with the provisional adhesive layer 3 stuck thereto, as the molded plate 23 in which the rewiring layers 13 and the device chips 15 are integrally combined with each other by the molded resin 21 is formed.

When the rewiring layers 13 and the molded resin 21 are peeled off the provisional adhesive layer 3, i.e., the support member 1, reverse sides 5d of the rewiring layers 13 and a reverse side 21b of the molded resin 21 that have been held in intimate contact with the provisional adhesive layer 3 are exposed. Some of the electrically conductive layers 7 exist on the reverse sides 5d of the rewiring layers 13. Consequently, when the rewiring layers 13 and the molded resin 21 are peeled off the provisional adhesive layer 3, those electrically conductive layers 7 are also exposed.

After the molded plate 23 has been formed, bumps 25 made of an electrically conductive material are put on the reverse sides 5d of the rewiring layers 13. The bumps 25 are typically made of metal such as gold, silver, copper, tin, or nickel and are connected to the electrically conductive layers 7 that are exposed on the reverse sides 5d of the rewiring layers 13. Thus, voltages can be applied to the electrodes 19 of the devices, i.e., the device chips 15, through the bumps 25 and the electrically conductive layers 7.

Figure 3A:
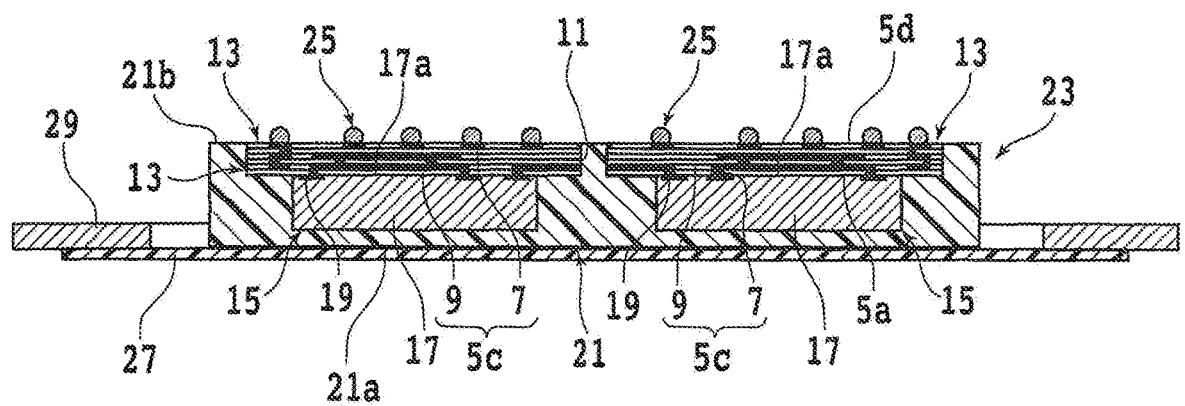
FIG. 3A is a cross-sectional view illustrating the state in which the molded plate is supported on a frame by a dicing tape according to Embodiment 1.

After the bumps 25 have been disposed on the molded plate 23, the face side 21a of the molded resin 21 of the molded plate 23 is supported, and the reverse sides 5d of the rewiring layers 13, i.e., the reverse side 21b of the molded resin 21, are exposed (supporting step). FIG. 3A is a cross-sectional view illustrating the state in which the molded plate 23 is supported on an annular frame 29 by a dicing tape 27.

As illustrated in FIG. 3A, the dicing tape 27 that is larger than the face side 21a of the molded resin 21 is stuck to the face side 21a. The annular frame 29 is fixed to an outer edge portion of the dicing tape 27 in surrounding relation to the molded plate 23. As a result, the molded plate 23 is supported on the annular frame 29 by the dicing tape 27. The reverse sides 5d of the rewiring layers 13, i.e., the reverse side 21b of the molded resin 21, are exposed without being covered with the dicing tape 27.

Figure 3B:
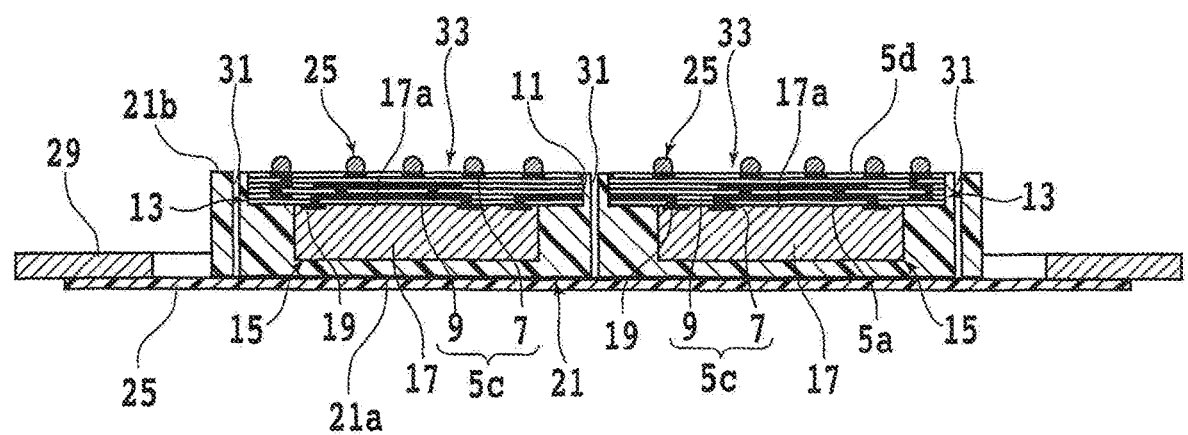
FIG. 3B is a cross-sectional view illustrating the state in which the molded resin is cut.

After the molded plate 23 has been supported on the annular frame 29 by the dicing tape 27, the molded resin 21 is cut and packaged device chips in which the device chips 15 are covered with molded resins 21 are formed (molded resin cutting step). FIG. 3B is a cross-sectional view illustrating the state in which the molded resin 21 is cut.

Specifically, an image of the molded plate 23 is captured by an unillustrated camera or the like, and the position of the dividing groove 11, typically the transversely central position of the dividing groove 11, is detected from the captured image. Then, the molded resin 21 is cut across an area disposed within the dividing groove 11 and narrower than the dividing groove 11. The molded resin 21 is cut from the side of the molded plate 23 where the rewiring layers 13 are exposed, i.e., from the reverse sides 5d of the rewiring layers 13 or the reverse side 21b of the molded resin 21.

For example, an unillustrated cutting blade including a plurality of abrasive grains bound together by a bonding agent is rotated and moved to cut into the area within the dividing groove 11, cutting the molded resin 21. To cut the molded resin 21, it is necessary to use a cutting blade narrower than the dividing groove 11, e.g., a cutting blade narrower than the cutting blade used to form the dividing groove 11.

However, the cutting of the molded resin 21 is not limited to any particular cutting process. For example, the molded resin 21 may be cut by an ablation process in which a laser beam having a wavelength absorbable or easily absorbable by the molded resin 21 is applied to the molded resin 21. In the ablation process, the power of the laser beam, the number of times that the laser beam is applied, etc. are adjusted to enable appropriate cutting of the molded resin 21.

When the molded resin 21 is cut across the area within the dividing groove 11, the molded plate 23 is divided into a plurality of packaged device chips 33 along a slit or kerf 31 formed in the molded plate 23 as it is cut. According to the present embodiment, since the molded resin 21 is cut across the area within the dividing groove 11, no rewiring layers 13 are exposed in the slit 31. In other words, the rewiring layers 13 have side surfaces remaining covered with the molded resin 21.

According to the present embodiment, the molded resin 21 is cut in areas where the dividing groove 11 is not formed, i.e., areas corresponding to outer edge portions of the molded plate 23, in order to remove the outer edge portions of the molded plate 23 that are not necessary in the packaged device chips 33. When the molded resin 21 is cut in the areas where the dividing groove 11 is not formed, it is important not to cut the rewiring layer 5, i.e., the rewiring layers 13. The packaged device chips 33 in which the device chips 15 are covered with the molded resins 21 are completed according to the above processing sequence.

In the method of manufacturing a packaged device chip according to the present embodiment, the dividing groove 11 for dividing the rewiring layer 5 into the plural rewiring layers 13 is formed in the rewiring layer 5, and then the device chips 15 and the rewiring layers 13 are covered with the molded resin 21 as it fills the dividing groove 11, after which the molded resin 21 is cut across the area disposed within the dividing groove 11 and narrower than the dividing groove 11, thereby forming the packaged device chips 33. Consequently, the molded resin 21 and the rewiring layer 5 are not cut simultaneously together.

Since a smaller load is imposed on the interface between the molded resin 21 and the rewiring layer 5, i.e., the rewiring layers 13, than in a case where the molded resin 21 and the rewiring layer 5 are cut simultaneously together, the rewiring layers 13 are less liable to peel off the molded resin 21. Furthermore, as the side surfaces of the rewiring layers 13 are covered with the molded resin 21, the produced packaged device chips 33 are highly reliable.

Embodiment 2

Figure 4A:
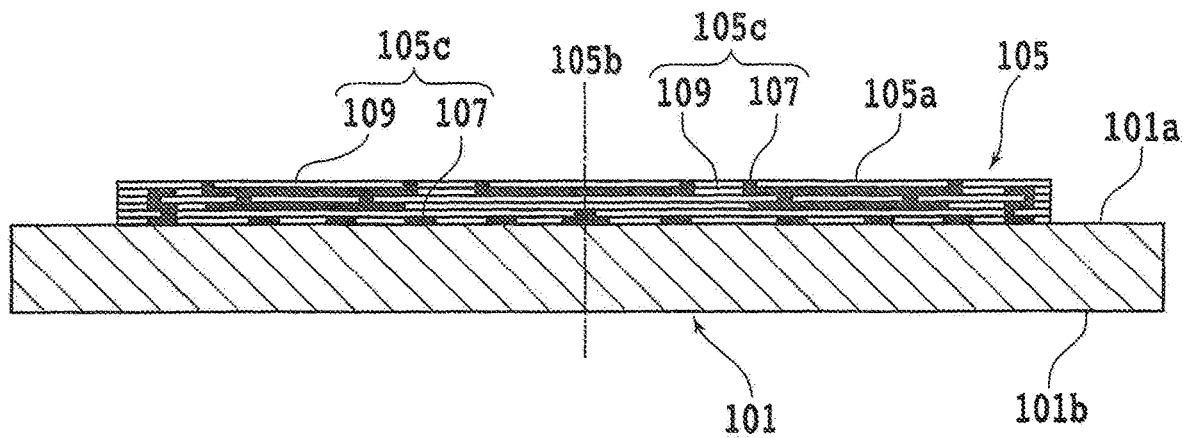
FIG. 4A is a cross-sectional view illustrating the state in which a rewiring layer is formed on a support member according to Embodiment 2 of the present invention.

In Embodiment 2, those features which are different from Embodiment 1 will mainly be described below. In a method of manufacturing a packaged device chip according to Embodiment 2, a rewiring layer is formed on a surface of a support member (rewiring layer forming step). FIG. 4A is a cross-sectional view illustrating the state in which a rewiring layer 105 is formed on a support member 101 according to Embodiment 2. The support member 101 used in the present embodiment may be the same as the support member 1 according to Embodiment 1, for example. However, a through-silicon via (TSV) substrate with devices such as integrated circuits formed thereon, an interposer substrate, or the like may also be used as the support member 101.

According to the present embodiment, the rewiring layer 105 is formed on a first surface 101a of the support member 101. In other words, no provisional adhesive layer is formed on the first surface 101a of the support member 101. A manufacturing process for the rewiring layer 105, structural details thereof, etc. may be the same as the manufacturing process for the rewiring layer 5 according to Embodiment 1, the structural details thereof, etc., for example. In other words, the rewiring layer 105 includes a layered structure of electrically conductive layers 107 and insulating layers 109.

The rewiring layer 105 has an exposed surface 105a, i.e., a surface opposite the surface facing the support member 101, demarcated into a plurality of areas by projected dicing lines 105b generally parallel to the surface 105a. Each of the areas includes a rewiring pattern 105c of electrically conductive layers 107 and insulating layers 109. Some of the electrically conductive layers 107 of the rewiring patterns 105c are exposed on the surface 105a of the rewiring layer 105.

Figure 4B:
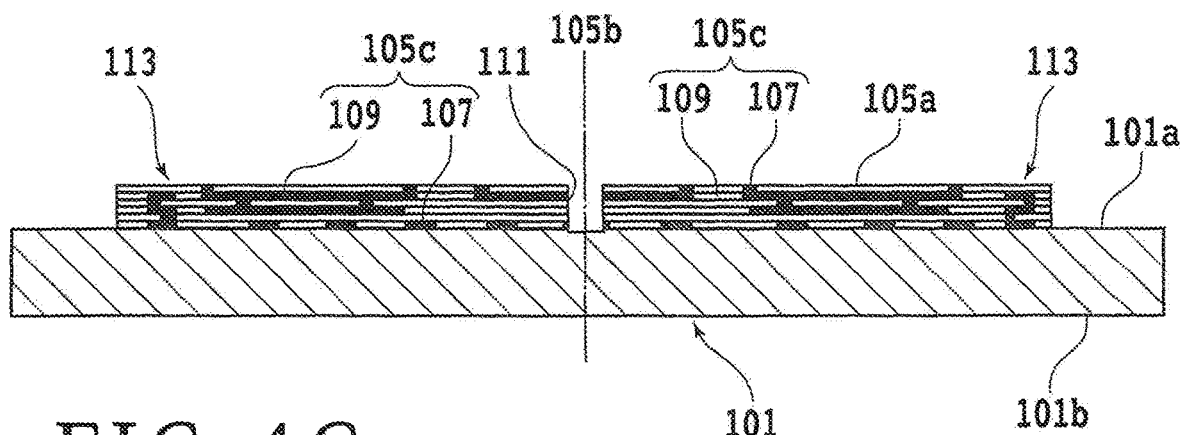
FIG. 4B is a cross-sectional view illustrating the state in which a dividing groove for dividing the rewiring layer is formed therein.

After the rewiring layer 105 has been formed on the support member 101, dividing grooves for dividing the rewiring layer 105 are formed therein along the projected dicing lines 105b (dividing groove forming step). FIG. 4B is a cross-sectional view illustrating the state in which a dividing groove 111 for dividing the rewiring layer 105 is formed therein. A process of forming the dividing groove 111 may be the same as the process of forming the dividing groove 11 according to Embodiment 1, for example.

The rewiring layer 105 is divided into a plurality of rewiring layers 113 by the dividing groove 111. According to the present embodiment, the depth to which the cutting blade cuts into the rewiring layer 105, the power of the laser beam to be applied, or the like is adjusted to form the dividing groove 111 that has a bottom at a position deeper than the first surface 101a of the support member 101, i.e., a position separated from the first surface 101a toward a second surface 101b of the support member 101.

Since molded resin to be formed subsequently can thus be held in contact with the support member 101 through a wider area than in a case where a dividing groove that has a bottom at the same depth as the first surface 101a is formed, for example, the molded resin is less likely to peel off the support member 101. However, the depth of the bottom of the dividing groove 111 can be varied insofar as the support member 101 is exposed at the bottom.

Figure 4C:
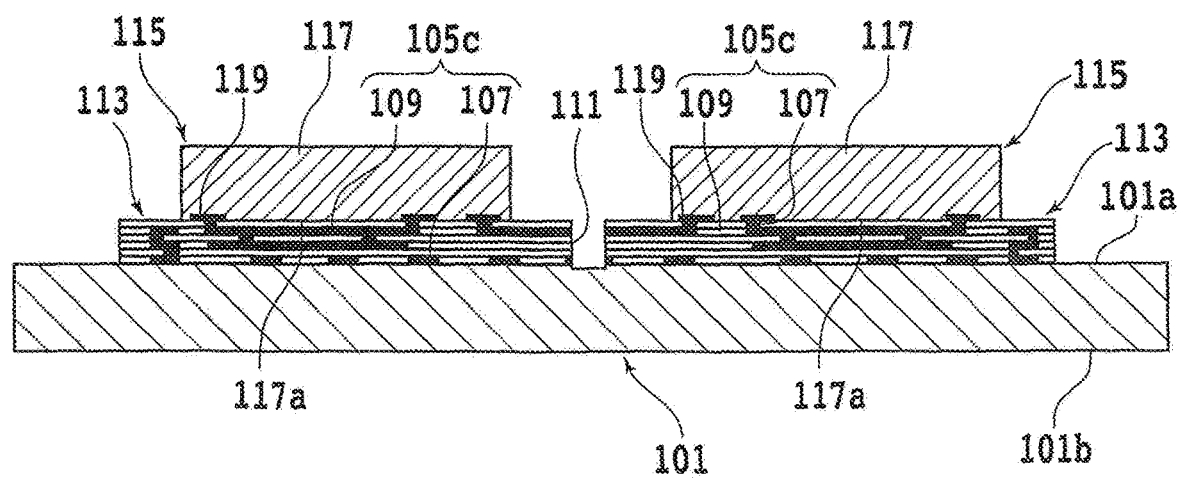
FIG. 4C is a cross-sectional view illustrating the state in which rewiring patterns included in rewiring layers and device chips are connected to each other.

After the dividing groove 111 has been formed, device chips are placed on the respective rewiring layers 113, i.e., a plurality of areas of the rewiring layer 105, and the rewiring patterns 105c included in the respective rewiring layers 113 are connected to the device chips (device chip connecting step). FIG. 4C is a cross-sectional view illustrating the state in which the rewiring patterns 105c included in the rewiring layers 113 and device chips 115 are connected to each other.

The device chips 115 used in the present embodiment may be the same as the device chips 15 according to Embodiment 1, for example. The device chips 115 include substrates 117 made of a semiconductor such as silicon. The devices have electrodes 119 exposed on the surfaces 117a of the substrates 117.

According to the present embodiment, the device chips 115 are placed on and fixed to the respective rewiring layers 113, i.e., the plural areas of the rewiring layer 105, such that the electrodes 119 of the devices are connected to the electrically conductive layers 107, i.e., the rewiring patterns 105c, exposed on the surfaces 105a of the rewiring layers 113. The bonding of the electrically conductive layers 107 and the electrodes 119 is not limited to any particular bonding process, i.e., the fixing of the device chips 115 and the rewiring layers 113 is not limited to any particular fixing process.

Figure 5A:
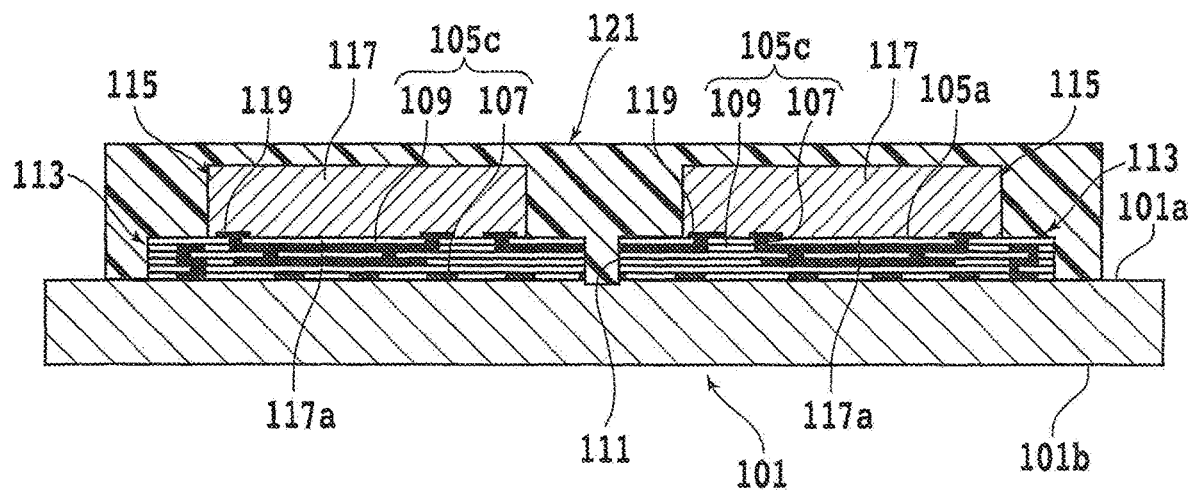
FIG. 5A is a cross-sectional view illustrating the state in which the device chips and the rewiring layers are covered with molded resin according to Embodiment 2.

After the dividing groove 111 has been formed in the rewiring layer 105 and the rewiring patterns 105c and the device chips 115 have been connected to each other, the device chips 115 and the rewiring layers 113 are covered with molded resin as it fills the dividing groove 111 (molding step). FIG. 5A is a cross-sectional view illustrating the state in which the device chips 115 and the rewiring layers 113 are covered with molded resin 121. A process of covering the device chips 115 and the rewiring layers 113 with the molded resin 121 may be the same as the process according to Embodiment 1, etc.

Figure 5B:
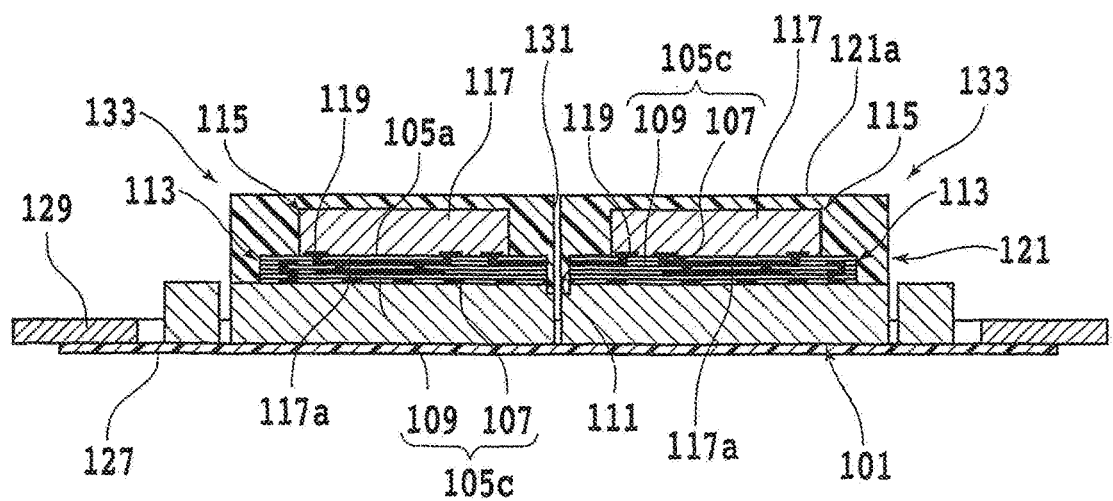
FIG. 5B is a cross-sectional view illustrating the state in which the molded resin and the support member are cut.

After the molded resin 121 has been formed in covering relation to the device chips 115 and the rewiring layers 113, the molded resin 121 is cut and packaged device chips in which the device chips 115 are covered with molded resins 121 are formed (molded resin cutting step). According to the present embodiment, the molded resin 121 and the support member 101 are cut together. FIG. 5B is a cross-sectional view illustrating the state in which the molded resin 121 and the support member 101 are cut.

When the molded resin 121 and the support member 101 are to be cut, a dicing tape 127 is stuck to the second surface 101b of the support member 101, for example. An annular frame 129 is fixed to an outer edge portion of the dicing tape 127. As a result, the support member 101 is supported on the annular frame 129 by the dicing tape 127. A face side 121a of the molded resin 121, i.e., a surface opposite the surface facing the support member 101, is exposed without being covered with the dicing tape 127.

After the support member 101 has been supported on the annular frame 129 by the dicing tape 127, the molded resin 121 and the support member 101 are cut together across an area disposed within the dividing groove 111 and narrower than the dividing groove 111. The molded resin 121 and the support member 101 are cut from the exposed face side 121a of the molded resin 121.

For example, an unillustrated cutting blade including a plurality of abrasive grains bound together by a bonding agent is rotated and moved to cut into the area within the dividing groove 111, cutting the molded resin 121 together with the support member 101. To cut the molded resin 121 and the support member 101, it is necessary to use a cutting blade narrower than the dividing groove 111, e.g., a cutting blade narrower than the cutting blade used to form the dividing groove 111.

However, the cutting of the molded resin 121 and the support member 101 is not limited to any particular cutting process. For example, the molded resin 121 and the support member 101 may be cut by an ablation process in which a laser beam having a wavelength absorbable or easily absorbable by the molded resin 121 and the support member 101 is applied to the molded resin 121 and the support member 101. In the ablation process, the power of the laser beam, the number of times that the laser beam is applied, etc. are adjusted to enable appropriate cutting of the molded resin 121 and the support member 101.

When the molded resin 121 and the support member 101 are cut across the area within the dividing groove 111, they are divided into a plurality of packaged device chips 133 along a slit or kerf 131 formed in the molded resin 121 and the support member 101 as they are cut. According to the present embodiment, since the molded resin 121 is cut across the area within the dividing groove 111, no rewiring layers 113 are exposed in the slit 131. In other words, the rewiring layers 113 have side surfaces remaining covered with the molded resin 121.

According to the present embodiment, the molded resin 121 and the support member 101 are cut in areas where the dividing groove 111 is not formed, i.e., areas corresponding to outer edge portions of the molded resin 121 and the support member 101, in order to remove the outer edge portions of the molded resin 121 and the support member 101 from the packaged device chips 133.

When the molded resin 121 is cut in the areas where the dividing groove 111 is not formed, it is important not to cut the rewiring layer 105, i.e., the rewiring layers 113. The packaged device chips 133 in which the device chips 115 are covered with the molded resins 121 are completed according to the above processing sequence.

In the method of manufacturing a packaged device chip according to the present embodiment, the dividing groove 111 for dividing the rewiring layer 105 into the plural rewiring layers 113 is formed in the rewiring layer 105, and then the device chips 115 and the rewiring layers 113 are covered with the molded resin 121 as it fills the dividing groove 111, after which the molded resin 121 and the support member 101 are cut across the area disposed within the dividing groove 111 and narrower than the dividing groove 111, thereby forming the packaged device chips 133. Consequently, the molded resin 121 and the rewiring layer 105 are not cut simultaneously together.

Since a smaller load is imposed on the interface between the molded resin 121 and the rewiring layer 105, i.e., the rewiring layers 113, than in a case where the molded resin 121 and the rewiring layer 105 are cut simultaneously together, the rewiring layers 113 are less liable to peel off the molded resin 121. Furthermore, as the side surfaces of the rewiring layers 113 are covered with the molded resin 121, the produced packaged device chips 133 are highly reliable.

The present invention is not limited to the above embodiments, and various changes and modifications may be made therein. For example, according to the above embodiments, after the dividing groove 11 (the dividing groove 111) for dividing the rewiring layer 5 (the rewiring layer 105) into the rewiring layers 13 (the rewiring layers 113) has been formed in the rewiring layer 5 (the rewiring layer 105) along the projected dicing line 5b (the projected dicing line 105b), the rewiring patterns 5c (the rewiring patterns 105c) and the device chips 15 (the device chips 115) are connected to each other. However, these steps may be switched around. In other words, the dividing groove forming step may be carried out after the device chip connecting step has been carried out.

According to Embodiment 2, the molded resin 121 is cut together with the support member 101 from the face side 121a of the molded resin 121. However, the molded resin 121 may be cut together with the support member 101 from the second surface 101b of the support member 101. In this case, the dicing tape 127 may be stuck to the face side 121a of the molded resin 121, and the annular frame 129 may be fixed to the outer edge portion of the dicing tape 127.

In a case where the support member 101 is opaque to visible light, the position of the dividing groove 111, typically the transversely central position of the dividing groove 111, can be detected from the second surface 101b of the support member 101, using an unillustrated infrared camera or the like. Consequently, in the case where the support member 101 is opaque to visible light, the molded resin 121 and the support member 101 can be cut across an appropriate area, i.e., an area disposed within the dividing groove 111 and narrower than the dividing groove 111, from the second surface 101b of the support member 101.

Similarly, according to Embodiment 1, the molded resin 21 is cut from the side of the molded plate 23 where the rewiring layers 13 are exposed, i.e., from the reverse side 21b of the molded resin 21. In a case where the bumps 25, etc. pose no problem, for example, the molded resin 21 can be cut from the face side 21a of the molded resin 21.

Furthermore, after the packaged device chips 33 (the packaged device chips 133) have been formed, i.e., after the molded resin cutting step, a metal layer for cutting off electromagnetic waves, i.e., an electromagnetic wave shield layer, may be formed on the exposed surface of the molded resin 21 (the molded resin 121) (metal layer forming step). The metal layer may be formed according to a process such as sputtering, for example.

The structural details, processes, etc. with respect to the above embodiments, modifications, etc. can be changed or modified without departing from the scope of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a packaged device chip, comprising the steps of:
    forming a rewiring layer having rewiring patterns respectively in a plurality of areas demarcated on the rewiring layer by a projected dicing line on a first surface of a support member that has a second surface opposite the first surface;
    after the step of forming the rewiring layer, forming a dividing groove for dividing the rewiring layer by cutting the rewiring layer along the projected dicing line;
    placing device chips in the respective areas on the rewiring layer and connecting the rewiring patterns and the device chips to each other;
    after the steps of forming the dividing groove and connecting the rewiring patterns and the device chips, covering the device chips and the rewiring layer with molded resin while filling the dividing groove with the molded resin; and
    after the step of covering the device chips and the rewiring layer with the molded resin, cutting the molded resin across an area disposed within the dividing groove and narrower than the dividing groove and forming packaged device chips in which the device chips are covered with the molded resin,
    wherein a side surface of the rewiring layer cut in the step of dividing the groove is covered with the molded resin.

2. The method of manufacturing a packaged device chip according to claim 1, further comprising the step of:
    after the step of covering the device chips and the rewiring layer with the molded resin, peeling the rewiring layer and the molded resin off the support member to form a molded plate in which the rewiring layer and the device chips are integrally combined with each other by the molded resin.

3. The method of manufacturing a packaged device chip according to claim 1,
    wherein the molded resin and the support member are cut together in the step of cutting the molded resin.

4. The method of manufacturing a packaged device chip according to claim 1, wherein an adhesive layer is provided between the rewiring layer and the first surface of the support member.

5. The method of manufacturing a packaged device chip according to claim 4, wherein a depth of the dividing groove stops at the adhesive layer.

6. The method of manufacturing a packaged device chip according to claim 4, wherein the rewiring layer covered with the molded resin is peeled off from the support layer prior to cutting the molded resin.

* * * * *